Jan. 23, 1973 J. A. WAGNER 3,713,014

VARACTOR MULTIPLIER INCLUDING INPUT CIRCUIT FOR INCREASING BAND OF OPERATION

Filed Aug. 11, 1971

INVENTOR
JAMES A. WAGNER
BY
Mueller & Aichele
ATTYS.

United States Patent Office 3,713,014

Patented Jan. 23, 1973

3,713,014

VARACTOR MULTIPLIER INCLUDING INPUT CIRCUIT FOR INCREASING BAND OF OPERATION

James A. Wagner, Palatine, Ill., assignor to Motorola, Inc., Franklin Park, Ill.

Filed Aug. 11, 1971, Ser. No. 170,833
Int. Cl. H02m 5/30
U.S. Cl. 321—69 NL 14 Claims

ABSTRACT OF THE DISCLOSURE

A varactor multiplier has an input circuit including a secondary circulating circuit comprised of an inductor and a capacitor which are tuned to a frequency near the second harmonic of the input frequency thereby providing a net capacitance at the input frequency which lowers the composite resonant frequency of the multiplier so that its band of operation is increased. The secondary circulating circuit also provides a net inductance at harmonic frequencies of a higher order than the second thereby desensitizing the multiplier to tuning and temperature changes of the output and idler circuits. Furthermore, the secondary circulating circuit forms part of the impedance transformation network which matches the varactor to its driver.

BACKGROUND OF THE INVENTION

In many communication applications, radio frequency oscillators and other signal sources, which are stable only at relatively low radio frequencies, are utilized to generate and sometimes frequency modulate a signal. To facilitate transmission, various electronic circuits are employed to multiply the frequency or frequencies of this signal. Frequency multipliers operating in the very high frequency and ultra-high frequency regions of the spectrum make use of varactor circuits because they provide high conversion efficiencies and relatively large power handling capabilities at a moderate cost and with minimum complexity.

These varactor multipliers usually include an input circuit for transferring maximum power at the fundamental or pump frequency to the varactor and an output circuit for transferring maximum power at the multiplied frequency to a load. In addition, to achieve maximum efficiency, varactor multipliers which multiply by integers greater than 2 include idler circuits for circulating selected frequencies other than the input and output frequencies through the nonlinear varactor reactance without unnecessarily dissipating energy in either the load or source impedances.

Although prior art varactor multipliers operate satisfactorily in many applications, certain disadvantages have been encountered when using such circuits to multiply frequency modulated (FM) signals centered about any-one of a plurality of center frequencies. In particular, if the varactor circuit becomes resonant at one of the frequencies of the applied input signal, a negative resistance effect is created which tends to cause the power of the output signal to be at any one of three possible levels or to exhibit "jump phenomena." Moreover, the negative resistance of the varactor multiplier tends to cause regeneration in its driving circuit which can result in the circulation of many undesired frequencies which may exceed the power dissipation of the driving circuit. Also, even though the multiplier does not exhibit the negative resistance effect for one band of input frequencies, switching the transmitter to a different center frequency or channel, tuning of the idler circuits, or changes in component values with temperature, can cause a change in composite reactance which creates the undesirable jump phenomena.

Furthermore, prior art multipliers having variable components connected between the varactor and the driving circuit require unnecessarily complicated alignment procedures which increases the cost of products including the multiplier circuits.

SUMMARY OF THE INVENTION

One object of this invention is to provide a simple, inexpensive varactor multiplier circuit which does not exhibit negative resistance effects within a desired band of operating frequencies even when subjected to a range of temperatures.

Another object of the invention is to provide a simple, reliable and inexpensive network which does not include variable components for coupling a driving circuit to a varactor used in a multiplier.

Still another object of the invention is to provide an improvide input coupling network for a varactor multiplier which facilitates impedance transformation and which selectively couples a narrow band of frequencies to a varactor.

A further object of the invention is to provide a network for coupling a driver circuit to a varactor multiplier utilizing idler and output circuits which decreases the sensitivity of the output power of the varactor to temperature change and to tuning of the idler and output circuits.

In brief, the invention relates to a frequency multiplier circuit which develops an output signal having a frequency which is a selected integral multiple of the frequency of an input signal. The frequency multiplier circuit includes a voltage variable capacitor, an input circuit adapted to couple the voltage variable capacitor to a driver, a primary idler circuit for conducting intermediate harmonics, an output circuit adapted to couple the voltage variable capacitor to a load, and a filter or secondary circulating circuit which passes selected signals within a frequency range near the second harmonic of the input signal. The secondary circulating circuit includes a series connected inductor and capacitor which provide an equivalent capacitance at the frequency of the input signal and, therefore, lowers the composite resonant frequency of the multiplier thus increasing the width of its band of operation. Moreover, the secondary circulating circuit can be combined with the input filter to provide part of the impedance transformation necessary to match the varactor impedance to that of its driver. The secondary circulating circuit may be tuned below the frequency of the second harmonic and in such case it provides an equivalent inductance at the second and all higher harmonics which tends to desensitize the varactor circuitry to temperature and tuning changes occurring in the high "Q" idler and output circuits.

DETAILED DESCRIPTION

Figures 1, 2, 3, 4, 5:
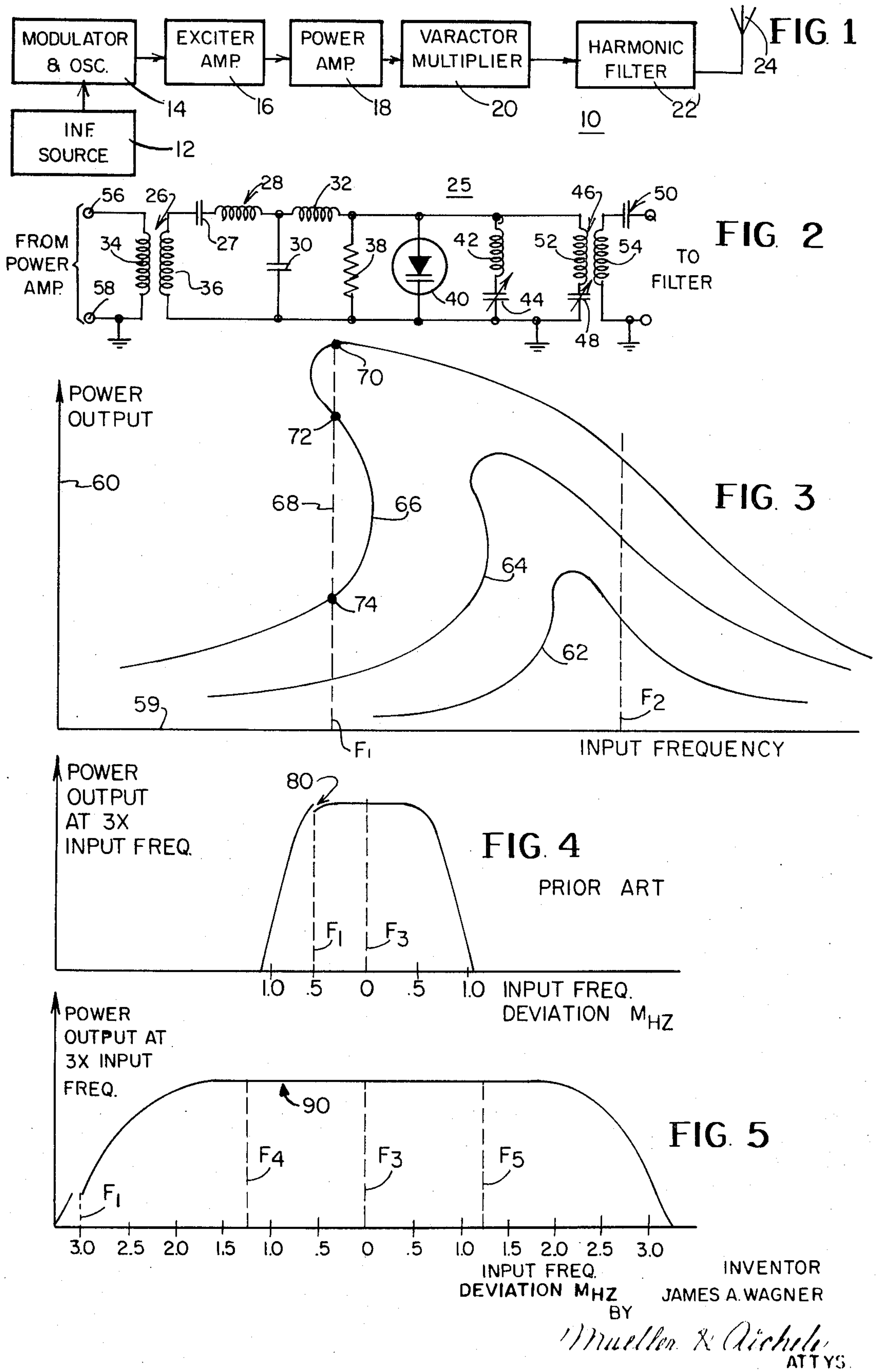
FIG. 1 is a block diagram of a frequency modulation transmitter which may use the multiplier of the invention.
FIG. 2 is a schematic diagram of a varactor multiplier which is suitable for use in the transmitter of FIG. 1.
FIG. 3 shows a family of theoretical power output versus frequency curves of a varactor multiplier for driving signals of three different amplitudes.
FIG. 4 shows a power output versus frequency curve for a varactor multiplier which does not include a secondary circulating circuit.
FIG. 5 is a power output versus frequency curve of the varactor multiplier shown in FIG. 2 which includes a secondary circulating circuit.

FIG. 1 is a block diagram of frequency modulation (FM) transmitter 10 including a varactor multiplier. The output of information source 12 is connected to the input of modulator-oscillator 14. Exciter amplifier 16 is connected between the output of modulator-oscillator 14 and the input of power amplifier 18. Modulator-oscillator 14 is capable of modulating any one of a plurality of center frequencies corresponding to each of a plurality of channels. Varactor multiplier 20 is connected between the output of power amplifier 18 and the input of harmonic filter 22. Transmitting antenna 24 is connected to the output of harmonic filter 22.

In operation, information source 12 applies an information signal to be transmitted to modulator-oscillator 14. Modulator-oscillator 14 combines the information signal and an oscillator or selected center frequency signal generated therein to provide an FM signal at its output. Exciter amplifier 16 increases the power level of the FM signal to a value suitable for driving power amplifier 18. The power level of the output signal of exciter 16 is further increased by power amplifier 18 which drives multiplier 20 and which may include solid-state components. Varactor multiplier 20 multiplies the frequency of each of the components of the output FM signal of power amplifier 18 by an integer or whole number to form harmonics at its output which can be efficiently transmitted by antenna 24.

FIG. 2 shows a schematic diagram of varactor multiplier circuit 25 of one embodiment of the invention which can be utilized as block 20 of FM transmitter 10 of FIG. 1. Varactor multiplier 25 includes an input impedance matching circuit having a transformer 26, a series resonant circuit comprised of capacitor 27 and inductor 28, and an "L" or secondary circulating circuit comprised of capacitor 30 and inductor 32. Primary winding 34 of transformer 26 may be connected to the output of a power amplifier stage, e.g., amplifier 18 of FIG. 1. Secondary winding 36 of transformer 24 is connected between a ground or reference potential and a first plate of capacitor 27. The second plate of capacitor 27 is connected to a first end of inductor 28. The second end of inductor 28 is connected to a first end of inductor 32 and to a first plate of capacitor 30. The second plate of capacitor 30 is connected to the ground or reference potential.

Bias resistor 38 is connected between the second end of inductor 32 and the ground or reference potential. Similarly, the anode of varactor diode or voltage variable capacitor means 40 is connected to the second end of inductor 32 and its cathode is connected to the ground or reference potential. A primary idler circuit, comprised of the series connection of the inductor 42 and capacitor 44, is connected between the anode and cathode of varactor 40.

Varactor multiplier 25 also includes an output circuit for matching varactor 40 to its load impedance, e.g., harmonic filter 22 of FIG. 1, for suppressing spurious and other undesired signals, and for selecting the desired harmonic signal produced by the multiplier. This output circuit includes a transformer 46, variable capacitor 48 and coupling capacitor 50. Primary winding 52 of transformer 46 is connected in series with variable capacitor 48 to form a series tuned circuit which is connected across varactor 40. Secondary winding 54 of transformer 46 is connected in series with coupling capacitor 50 to form a series tuned circuit across the input terminals of the load circuit.

The input matching network, which is comprised of components 26, 27, 28, 30 and 32, transforms the impedance of varactor 40 to match the driving source impedance across primary winding 34 of transformer 26. The input matching circuitry also provides a bandpass characteristic which passes the desired spectrum of the FM signal applied to input terminals 56 and 58, and attenuates all other frequencies. The FM signal is coupled to varactor 40 and bias resistor 38 by the input circuit. During a selected portion of each of the upper half cycles of this FM wave, the P-N junction of varactor 40 is forward biased which changes its impedance by the self biasing voltage developed across resistor 38, thus allowing a current spike to flow through the varactor. The capacitance and impedance transfer characteristics presented by the varactor diode also change as the FM signal swings through the rest of each cycle when the varactor diode is not forward biased. These changes in the impedance presented by the varactor diode results in distortion of the applied signal to form an intermediate signal having components which are integer multiples or harmonics of each frequency contained in the FM signal passes by the input circuit. Higher conversion efficiencies are achieved by the use of varactor diodes than by the use of other distorting impedances having large resistive components because the reactive impedance of the diode is relatively free from losses and it presents a relatively small resistive component.

If varactor multiplier 25 is used to generate a harmonic of higher order than two, it is desirable to provide idler frequency circuits therein which allow selected intermediate harmonic frequencies between the input and output harmonics to circulate through the nonlinear reactance provided by varactor 40 without unnecessarily dissipating energy in either the load or source impedances. In the case of the tripler shown in FIG. 2 one idler frequency at the second harmonic, which is equal to the difference between the third or selected harmonic and the pump or input frequency, is circulated by the primary idler including inductor 42 and capacitor 44. Inductor 52 and capacitor 48 which form part of the output circuit are tuned to select the third harmonic of the input signal.

By permitting the second harmonic to circulate, the primary idler circuit substantially increases the conversion efficiency of tripler 25. The harmonic energy developed by varactor 40 is distributed over many unwanted as well as the selected harmonics. Presence of the idler frequency enables varactor 40 to develop negative conductance at the selected harmonic frequency, which is equivalent to amplification, and to thereby partially cancel dissipative circuit losses. At high frequencies and for high multiplying factors, the efficiency and often the output power of multipliers including varactors is usually greater than for multipliers including either tubes or transistors.

If an output signal of higher order than three is desired then additional primary idler circuits should be included in multiplier 25. Alternatively, if frequency doubling is desired then no idler circuits are required.

A serious problem with most prior art varactor multipliers is illustrated by the theoretical family of input frequency versus power output curves of FIG. 3. Abscissa 59 indicates input signal frequency and ordinate axis 60 qualitatively indicates power output at the multiplied or output frequency. Curves 62, 64 and 66 illustrate the power output versus input frequency characteristics for a varactor multiplier being driven at each of three different drive levels of relatively increased magnitudes. To facilitate efficient operation, a relatively high drive level, as represented by curve 66, is usually necessary. However, as indicated by the dashed line 68 there is an input frequency, $F_1$ at which the varactor circuit becomes resonant and at which the power output of the varactor may be multi-valued. More specifically, a varactor operating at frequency, $F_1$ may have a power output of 25 watts as illustrated by point 70, or 20 watts as illustrated by point 72 or 10 watts as illustrated by point 74. This possibility of a multi-valued power output is accompanied by "jump" phenomena which indicates that the power output may "jump" from one level to another in response to slight tuning or temperature changes. This phenomena is also accompanied by the varactor providing a negative resistance which may result in unwanted signals being generated in the driving circuitry and thus, causing its power dissipation capability to be exceeded. Therefore, it is desirable to operate prior art varactor multipliers at a frequency, e.g., $F_2$, which is spaced from its self resonant frequency. This decreases the useful frequency range of the band of operation.

FIG. 4 illustrates a power output versus input frequency curve for a prior art varactor multiplier which does not include the secondary idler or circulating circuit comprised of inductor 32 and capacitor 30, but which includes a relatively high "Q" input circuit as compared to the "Q" of the input circuit of the multiplier of FIG. 2. As this prior art circuit is operated at selected input center frequencies within a range centered about $F_3$ of less than .9 megahertz (mHz.) the power output level remains substantially constant and stable. However, in response to the center frequency being changed to $F_1$ or to any value having a spectrum of components which include frequency $F_1$, which is about .5 mHz. less than $F_3$, the power output curve develops a discontinuity represented by point 80 because of the previously described "jump" phenomena.

Secondary circulating circuit, or capacitor 30 and inductor 32, which is tuned to a frequency slightly removed from the frequency of the second harmonic of the center frequency, in cooperation with components 26, 27, and 28, which form a broad banded input circuit, solves the foregoing problem. More specifically, assume that it is desired to multiply either a first input FM signal $F_4$ having a center frequency of 150 mHz. up to a center frequency of 450 mHz. or a second input signal, $F_5$ having a center frequency 153.5 mHz. up to a center frequency of about 460 mHz. to provide 2 channel operation. In this case the primary idler circuit comprised of inductor 42 and capacitor 44 is tuned to a band centered at about the second harmonic of the first input signal, e.g., 305 mHz., and the secondary circulating circuit comprised of capacitor 30 and inductor 32 is tuned to a frequency near the second harmonic e.g., 275 mHz. The exact resonant frequency of the circulating circuit, may be chosen empirically by maximizing circuit performance. Since the secondary circulating circuit is tuned to a frequency above the frequencies of either input signal and the resonant frequency of the multiplier, it appears as an equivalent capacitance at these frequencies. Hence, the secondary circulating circuit shifts the resonant frequency $F_1$ of the varactor multiplier away from the center frequency $F_3$, as illustrated by power output versus frequency curve 90 of FIG. 5. Hence, the jump phenomena or negative resistance effect is moved to about 3 mHz. away from the center frequency rather than .5 mHz., as in FIG. 4. The multiplier not having a secondary circulating circuit, as illustrated by FIG. 4, can efficiently provide nearly maximum power at tripled output signals spaced no more than about 3 mHz. apart whereas multiplier 25 can efficiently provide tripled output signals spaced up to 10 mHz. apart in response to input frequencies approximately equal to 150 mHz. Hence, the circulating circuit tuned to a frequency near the second harmonic enables the multiplier to accommodate FM input signals of substantially greater deviation or any one of a plurality of input signals having a greater separation between center frequencies to provide a wide range of output frequencies without exhibiting jump phenomena than a multiplier not having the secondary circulating circuit.

The idler and output circuits of varactor multipliers are comprised of components having high "Q's" or quality factors. In the past, temperature variations from −30° to +60° C. have caused these components to change value and sometimes detune the multiplier, which results in less efficient operation and, in marginal cases, jump phenomena. Moreover, the power outputs of prior art varactor circuits operating at high frequencies are unduly sensitive to the adjustment of variable components included in the input, idler and output circuits thereof thus making alignment difficult.

In applications where the circulating circuit comprised of capacitor 30 and inductor 32 is tuned below rather than above the second harmonic of the input signal, it appears as an equivalent inductive reactance at the frequency of the primary idler, having components 42 and 44, and as an even larger inductive reactance at the resonant frequency of the output frequency selecting circuit including components 48 and 52. Thus, the primary idler for the second harmonic and the circulating circuit cooperate to form a double tuned circuit at the second harmonic. The equivalent inductive reactances presented by the circulating circuit tend to make the power output and stability of the multiplier less sensitive to the tuning of variable capacitors 44 and 48 and less sensitive to temperature change causing variations in the values of high "Q" inductors 42 and 52 and capacitors 44 and 48.

The secondary circulating circuit also aids in impedance transformation between the driving circuit and the varactor. For instance, assume it is desired to step-up the predetermined 13 ohm resistance of varactor 40 to match a 50 ohm output impedance of its signal source e.g., power amplifier 18. The resistance of bias resistor 38 is usually large enough that it can be neglected in considering the transfer characteristic of the input filter. In this case, the values of inductor 32 and capacitor 30 may be chosen to have the proper ratio for stepping up the resistance of varactor 40 to an intermediate value of about 20 ohms across capacitor 30. The values of capacitor 27 and inductor 28 are selected to make the series tuned circuit formed by them nearly resonant at the center frequency of the driving signal and to also cancel out the reactive or imaginary component of the varactor secondary circulating circuit including capacitor 30 and inductor 32 and the varactor itself. Transformer 24 can be chosen to further transform the reflected resistance of varactor 40 up to the desired 50 ohm level. Thus, the input circuit includes no variable components and thus facilitates alignment.

The varactor tripler circuit 25 of FIG. 2 has been found to perform in a satisfactory manner in commercial FM communication equipment meeting rigid specifications. Components for circuit 25 suitable for multiplying a FM signal of center frequency of 150 mHz. up to 450 mHz. have the following values and designations:

| | |
|---|---|
| Primary winding **34** | 2½ turns. |
| Secondary winding **36** | 1¼ turns. |
| Capacitor **27** | 36 picofarads. |
| Inductor **28** | ½ inch diameter loop of #18 wire. |
| Capacitor **30** | 15 picofarads. |
| Inductor **32** | .006 microhenry. |
| Resistor **48** | 5.6 kilohms. |
| Varactor diode **40** | Varian, VAB 800. |
| Inductor **42** | .06 microhenry. |
| Capacitor **44** | 1 to 4 picofarads. |
| Inductor **52** | .024 microhenry. |
| Capacitor **48** | 1 to 4 picofarads. |
| Inductor **54** | .014 microhenry. |
| Capacitor **50** | 15 picofarads. |

The above values are by way of illustration and are not considered as limiting the scope of the invention.

What has been described, therefore, is a varactor multiplier circuit including an input impedance matching and tuning network formed from fixed components which also provides a secondary circulating circuit. The operating frequency range of the varactor multiplier is increased by the circulating circuit which also performs part of the impedance transformation necessary to match the varactor to its driving circuit. Furthermore, the circulating circuit desensitizes the multiplier to temperature and tuning changes in the primary idler and the output circuits. Hence, the secondary circulating circuit increases the reliability of the multiplier and facilitates alignment.

What is claimed is:

1. A frequency multiplier circuit for use with an input signal having a frequency within a band of frequencies, and for providing an output signal to a load having a frequency which is a selected integer multiple of the frequency of the input signal applied to the multiplier by a signal supply having an output impedance, the frequency multiplier circuit including in combination:

voltage variable capacitor means having first and second terminals and providing a predetermined impedance therebetween;

input circuit means including first and second filter means connected between the signal supply and said voltage variable capacitor means, said input circuit means transforming the output impedance of the signal supply to facilitate efficient power transfer from the signal supply to said voltage variable capacitor means, said first filter means being constructed to pass signals at frequencies within the band of frequencies and attenuate signals of other frequencies;

third filter means coupled to said voltage variable capacitor means and constructed to have a passband centered substantially at the center frequency of the second harmonic of a frequency within the band of frequencies of the input signal;

said second filter means being connected to said voltage variable capacitor means and constructed to have a passband centered substantially at a selected frequency having a predetermined frequency difference with respect to the center frequency of said third filter means, said second filter means cooperating with said third filter means to increase the useful bandwidth of the multiplier circuit; and output circuit means connected between said voltage variable capacitor means and the load, said output circuit means having fourth filter means constructed to attenuate signals at frequencies other than the desired frequencies of the output signal.

2. The frequency multiplier circuit of claim 1 wherein said selected frequency is at least 10 percent of the input frequency away from the center frequency of said third filter means.

3. The frequency multiplier circuit of claim 1 wherein the output signal is a harmonic that is greater than the third harmonic of the frequency of the input signal, and the frequency multiplier circuit further including primary idler means constructed to pass harmonics of the input signal between the second harmonic of the input signal and the frequency of the output signal to increase the conversion efficiency of the multiplier.

4. The frequency multiplier circuit of claim 3 wherein said primary idler means includes a series tuned circuit having a variable capacitor and an inductor, said series tuned circuit being connected between said first and second terminals of said voltage variable capacitor means.

5. The frequency multiplier circuit of claim 1 wherein said second filter means is connected between said voltage variable capacitor means and said first filter means, said second filter means being constructed to transform said predetermined impedance presented by said voltage variable capacitor means to an intermediate impedance; and said first filter means being connected between said second filter means and the signal supply, said first filter means being constructed to transform said intermediate impedance to approximately equal the output impedance of the signal supply.

6. The frequency multiplier circuit of claim 5 wherein said first filter means includes a series tuned circuit which is resonant near the center frequency of the input signal, said series tuned circuit having a first terminal and a second terminal;

first circuit means adapted to connect said first terminal of said series tuned circuit to the output of the signal supply; and said second filter means including inductor means and fixed capacitor means, said fixed capacitor means having a first plate connected to said second terminal of said series tuned circuit and a second plate connected to said first terminal of said voltage variable capacitor means, said inductor means having a first terminal connected to said first plate and a second terminal connected to said second terminal of said voltage variable capacitor means, said fixed capacitor means and said inductor means having a passband excluding the second harmonic and an upper frequency limit that is less than the third harmonic of the input signal to provide a circulating path for selected signals having frequencies within its passband.

7. The frequency multiplier circuit of claim 6 wherein said first circuit means includes a transformer having first and second windings, the first winding being connected to said signal supply and said second winding being connected to said first terminal of said series tuned circuit.

8. The frequency multiplier circuit of claim 6 wherein said first and second filter means include components all having fixed values.

9. The frequency multiplier circuit of claim 1 wherein said fourth filter means of said output circuit means includes a series tuned circuit having a variable capacitor and an inductor, said series tuned circuit being connected across said first and second terminals of said voltage variable capacitor means.

10. In a frequency multiplier circuit for providing an output signal to an electrical load at a frequency which is a selected harmonic of the frequency of an input signal provided to the multiplier by a signal supply having an output impedance, and wherein the multiplier circuit has a primary idler circuit tuned to all harmonics of the input frequency between the input frequency and the output frequency, and an output circuit tuned to the selected harmonic of the input frequency, the primary idler and the output circuits being connected to a voltage variable capacitor having first and second terminals, and a predetermined impedance, an input circuit for the frequency multiplier circuit including in combination:

a secondary circulating circuit having a first inductor and a first capacitor connected in series between the first and second terminals of the voltage variable capacitor, said secondary circulating circuit transforming the predetermined impedance of the voltage variable capacitor to an intermediate impedance having real and imaginary components across said first capacitor; said secondary circulating circuit being resonant at a selected frequency which is spaced a predetermined amount from the second harmonic of the input frequency and which is less than the third harmonic of the input frequency, and said secondary circulating circuit thereby decreasing the self resonant frequency of the multiplier;

series tuned circuit means including a second inductor and a second capacitor connected in series between the junction between said first capacitor and said first inductor and a third terminal, said series tuned circuit means being resonant at a frequency near the input frequency and cancelling out said imaginary component of said intermediate impedance; and first circuit means coupling the signal supply to said third terminal for applying the input signal thereto.

11. The combination of claim 10 wherein said first circuit means includes a transformer having primary and secondary windings, said primary winding being connected across the signal supply and said secondary winding being connected to said third terminal.

12. The combination of claim 10 further including resistor means connected from the first terminal to the second terminal of the voltage variable capacitor, said resistor means developing a biasing voltage for the voltage variable capacitor.

13. The combination of claim 10 wherein said resonant frequency of said secondary circulating circuit is about ten percent of said second harmonic of the input frequency less than said second harmonic.

14. The combination of claim 10 wherein said series tuned circuit has a lower quality factor than the quality factors of the primary idler circuit, said secondary circulating circuit and the output circuit.

References Cited

UNITED STATES PATENTS

| | | | |
|---|---|---|---|
| 3,341,714 | 9/1967 | Käch | 321—69 NL |
| 3,281,648 | 10/1966 | Collins | 321—69 W |
| 3,566,249 | 2/1971 | Leonard | 321—69 W |

GERALD GOLDBERG, Primary Examiner

U.S. Cl. X.R.

330—4.9; 331—76